US012667005B2

(12) United States Patent
     Osawa et al.

(10) Patent No.: US 12,667,005 B2
(45) Date of Patent: Jun. 23, 2026

(54) DISPLAY DEVICE

(71) Applicant: Japan Display Inc., Tokyo (JP)

(72) Inventors: Shuichi Osawa, Tokyo (JP);
               Yoshikatsu Imazeki, Tokyo (JP);
               Yoichi Kamijo, Tokyo (JP); **Koichi
               Miyasaka**, Tokyo (JP)

(73) Assignee: Japan Display Inc., Tokyo (JP)

( * ) Notice: Subject to any disclaimer, the term of this
              patent is extended or adjusted under 35
              U.S.C. 154(b) by 826 days.

(21) Appl. No.: 17/950,282

(22) Filed: Sep. 22, 2022

(65) Prior Publication Data

US 2023/0013526 A1        Jan. 19, 2023

Related U.S. Application Data

(63) Continuation      of      application      No.
     PCT/JP2021/000867, filed on Jan. 13, 2021.

(30) Foreign Application Priority Data

Mar. 26, 2020     (JP) ................................. 2020-056412

(51) Int. Cl.
     *H10W 90/00*        (2026.01)
     *H10H 20/856*       (2025.01)

(52) U.S. Cl.
     CPC .......... *H10W 90/00* (2026.01); *H10H 20/856*
                                                    (2025.01)

(58) Field of Classification Search
     CPC . H01L 25/0753; H01L 25/167; H10H 20/856;
          H10H 20/855; H10H 20/857; G09F 9/33;
                                          H04N 13/305
     See application file for complete search history.

(56) References Cited

U.S. PATENT DOCUMENTS

| 2012/0218173 | A1 | 8/2012 | Ohta et al. | |
| 2014/0240827 | A1 | 8/2014 | Asai et al. | |
| 2015/0084054 | A1* | 3/2015 | Fan ...................... | H10W 90/00 |
| | | | | 257/72 |
| 2015/0301343 | A1 | 10/2015 | Johnson et al. | |
| 2018/0284465 | A1* | 10/2018 | Kwon ................... | H10W 90/00 |
| 2019/0148470 | A1 | 5/2019 | Takagi | |
| 2020/0127178 | A1* | 4/2020 | Kapusta ............... | H10H 20/857 |
| 2024/0099038 | A1* | 3/2024 | Kubota ................... | H10F 30/20 |
| 2024/0266330 | A1* | 8/2024 | Chaji ................... | H10K 59/121 |

FOREIGN PATENT DOCUMENTS

| JP | 2011-60859 A | 3/2011 |

OTHER PUBLICATIONS

International Search Report mailed on Apr. 6, 2021, for the corre-
sponding PCT application No. PCT/JP2021/000867, with English
translation.

* cited by examiner

*Primary Examiner* — Eliseo Ramos Feliciano
*Assistant Examiner* — Thaddeus J Kolb
(74) *Attorney, Agent, or Firm* — Michael Best &
Friedrich LLP

(57)                ABSTRACT

According to one embodiment, a display device includes a
first insulating substrate including a first surface, a second
surface on an opposite side to the first surface and a concave
portion located in the second surface, and a first light-
emitting element and a second light-emitting element,
located in the concave portion, and an inner wall of the
concave portion includes a first inclined area and a second
inclined area opposing the first inclined area, the first
light-emitting element being located on the first inclined
area, and the second light-emitting element being located on
the second inclined area.

14 Claims, 19 Drawing Sheets

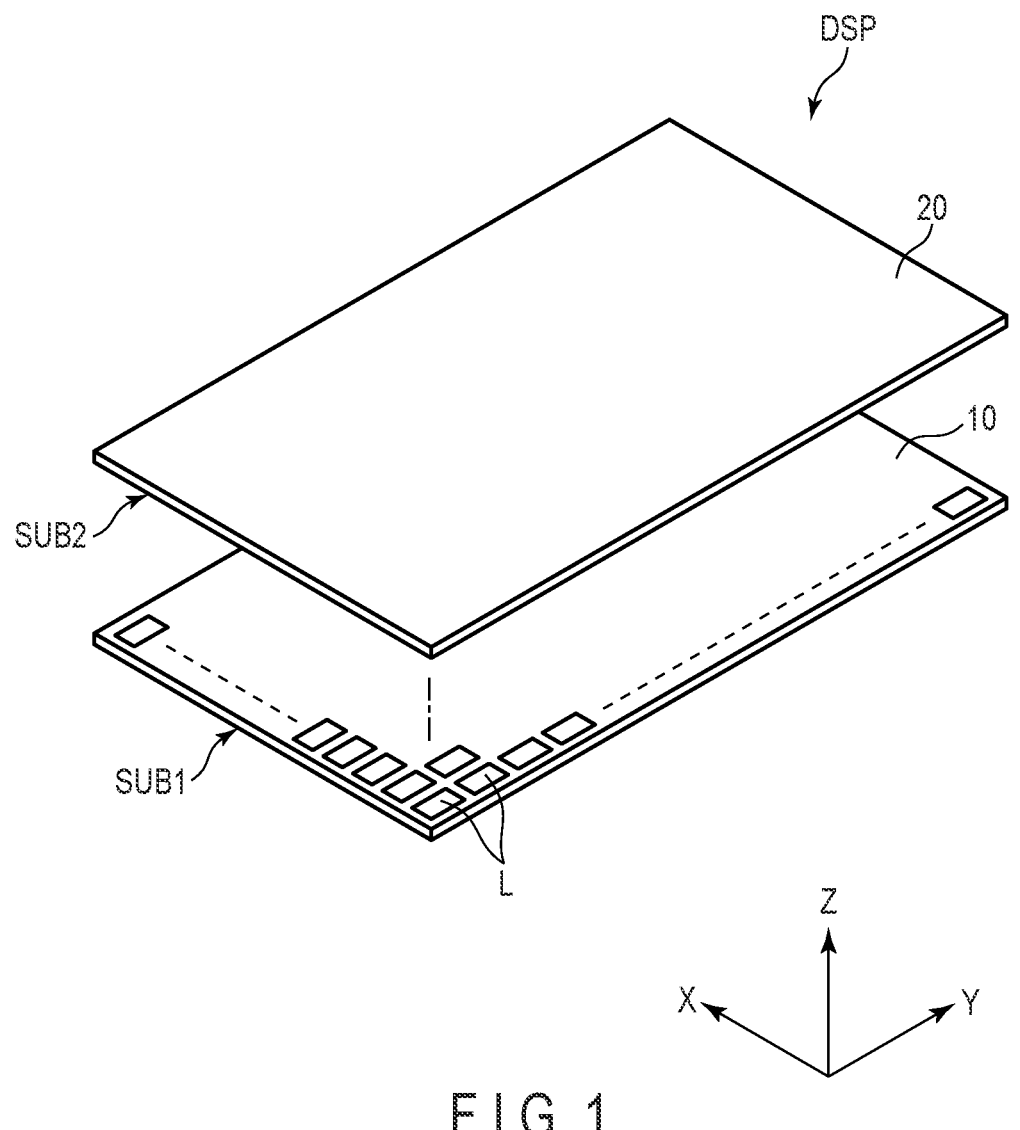
F I G . 1

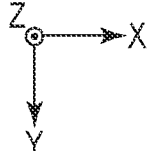
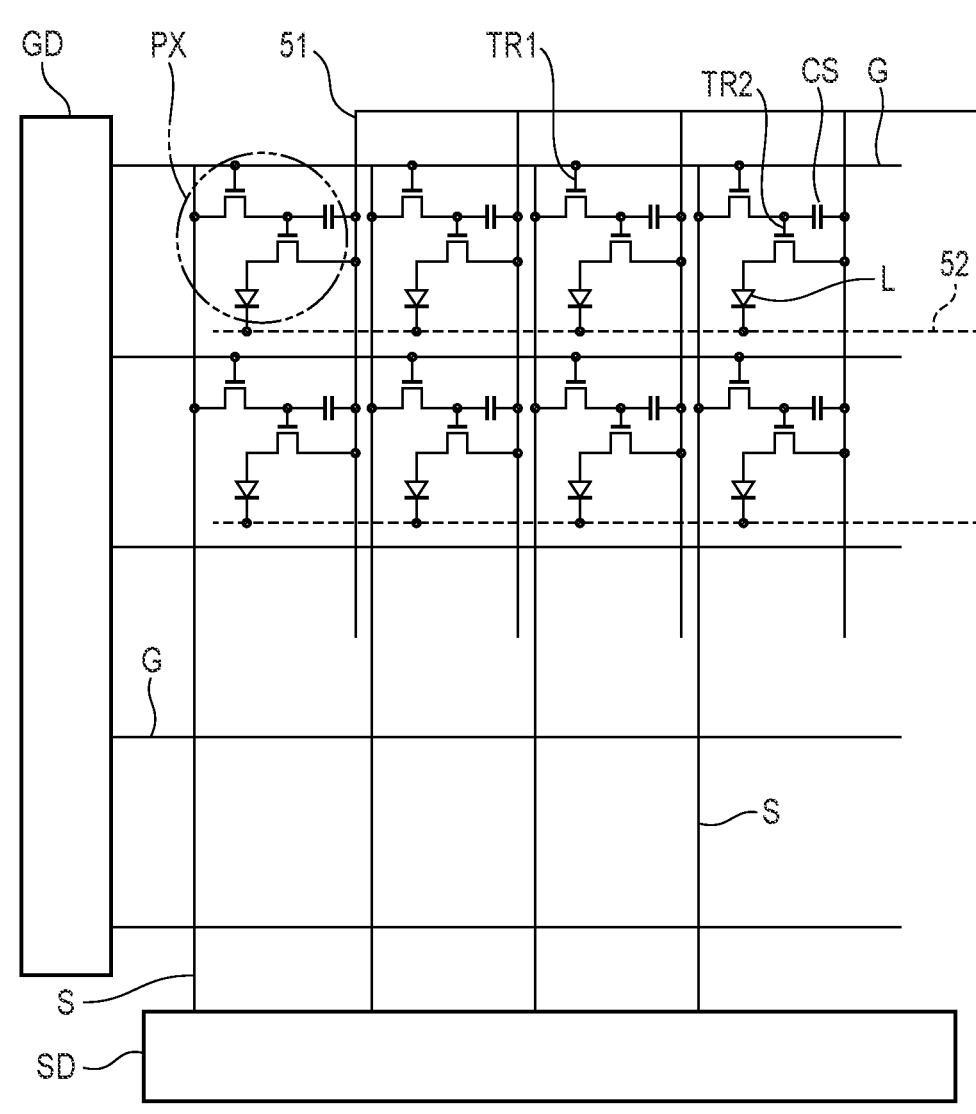
F I G. 2

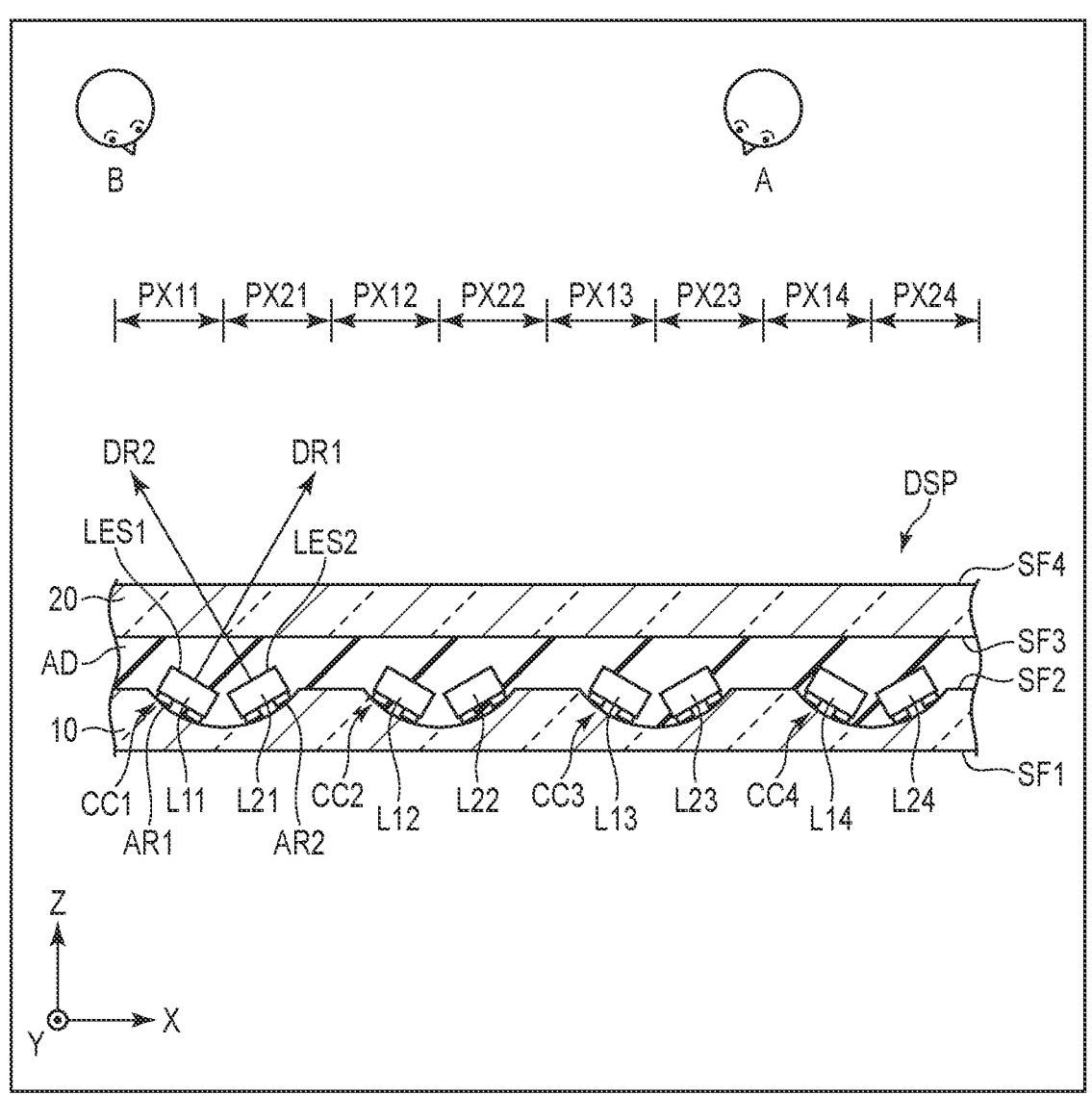
F I G. 3

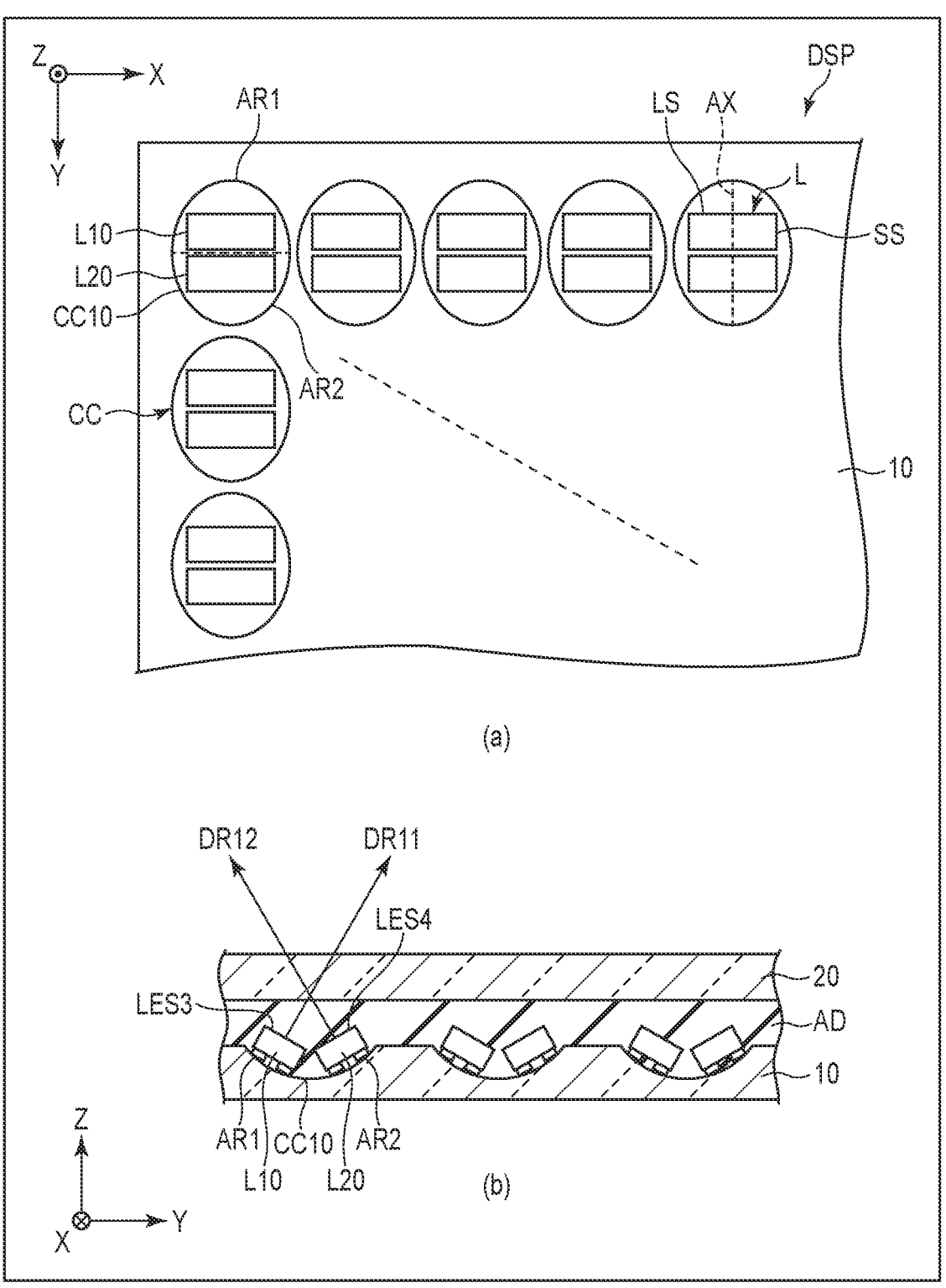
F I G. 4

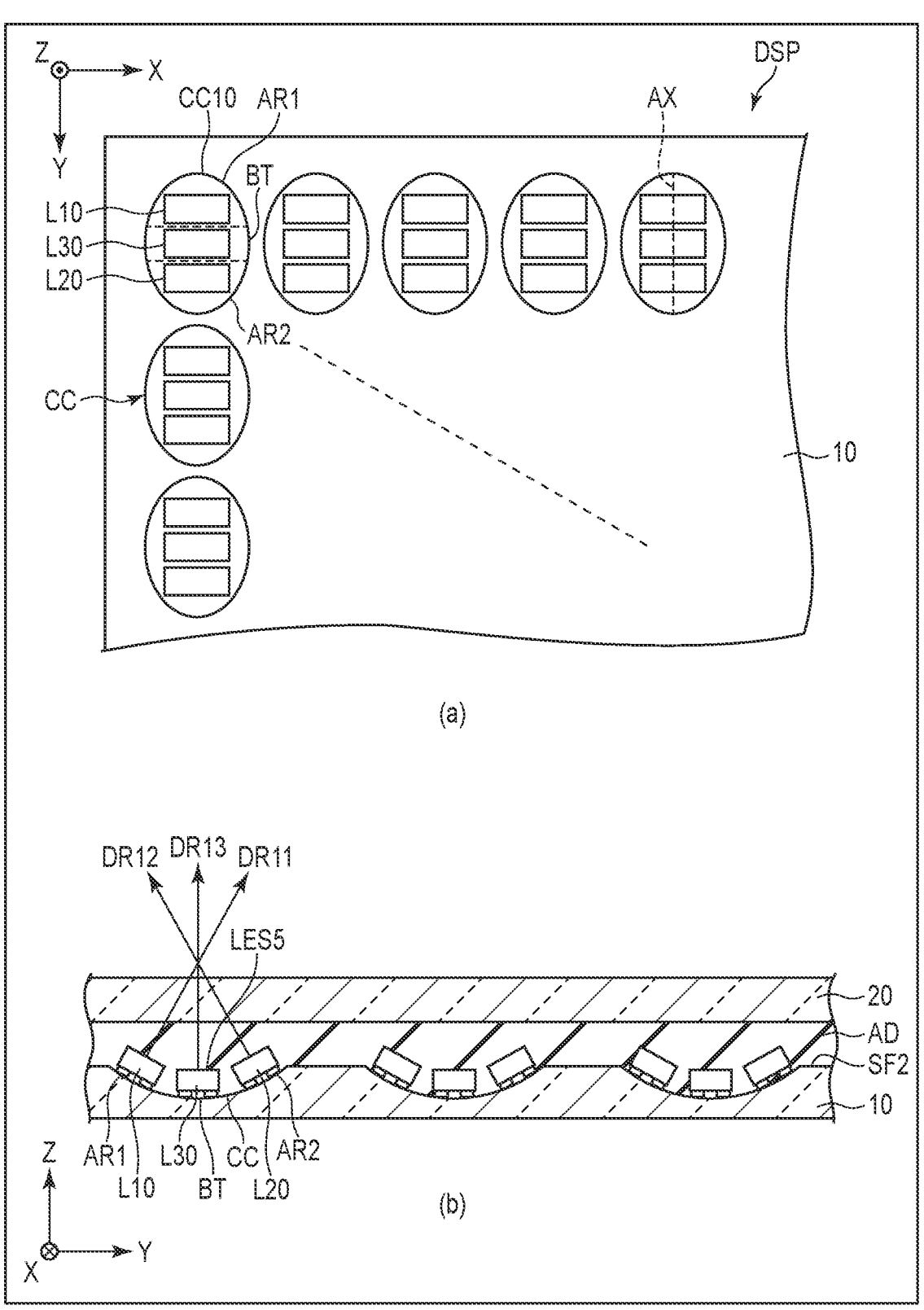
F I G. 5

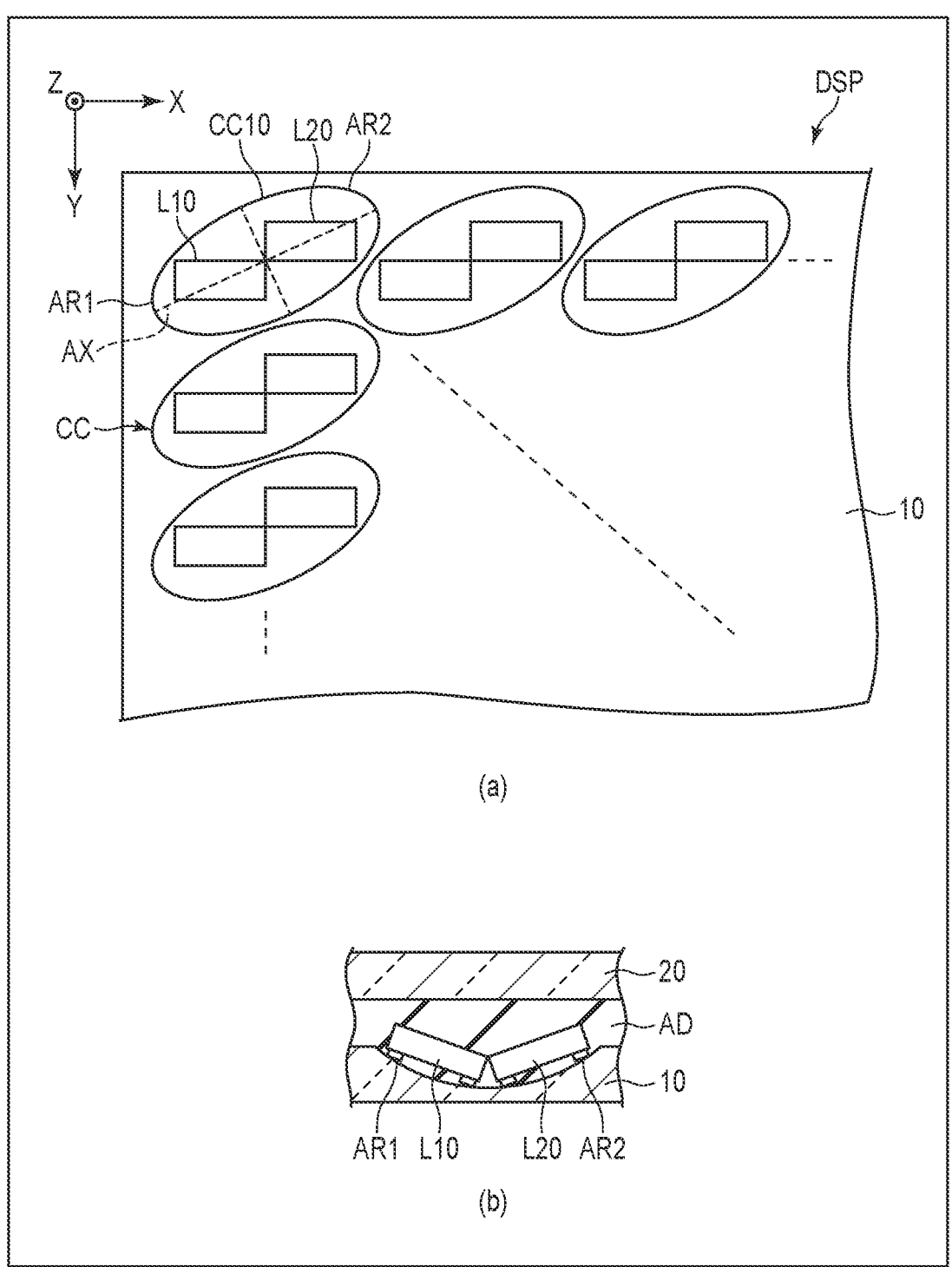
(a)
(b)
F I G. 8

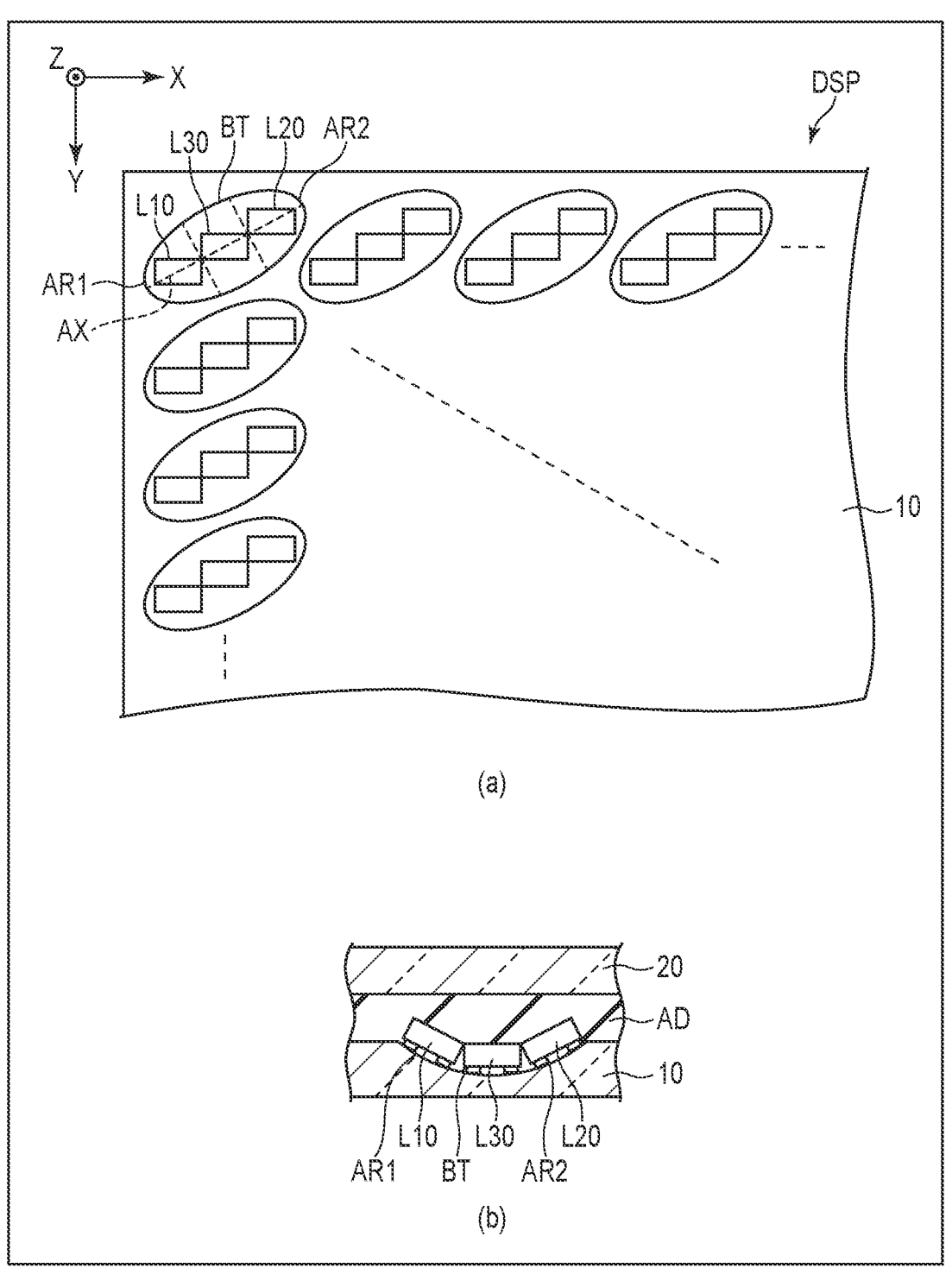
(a)
(b)
F I G. 9

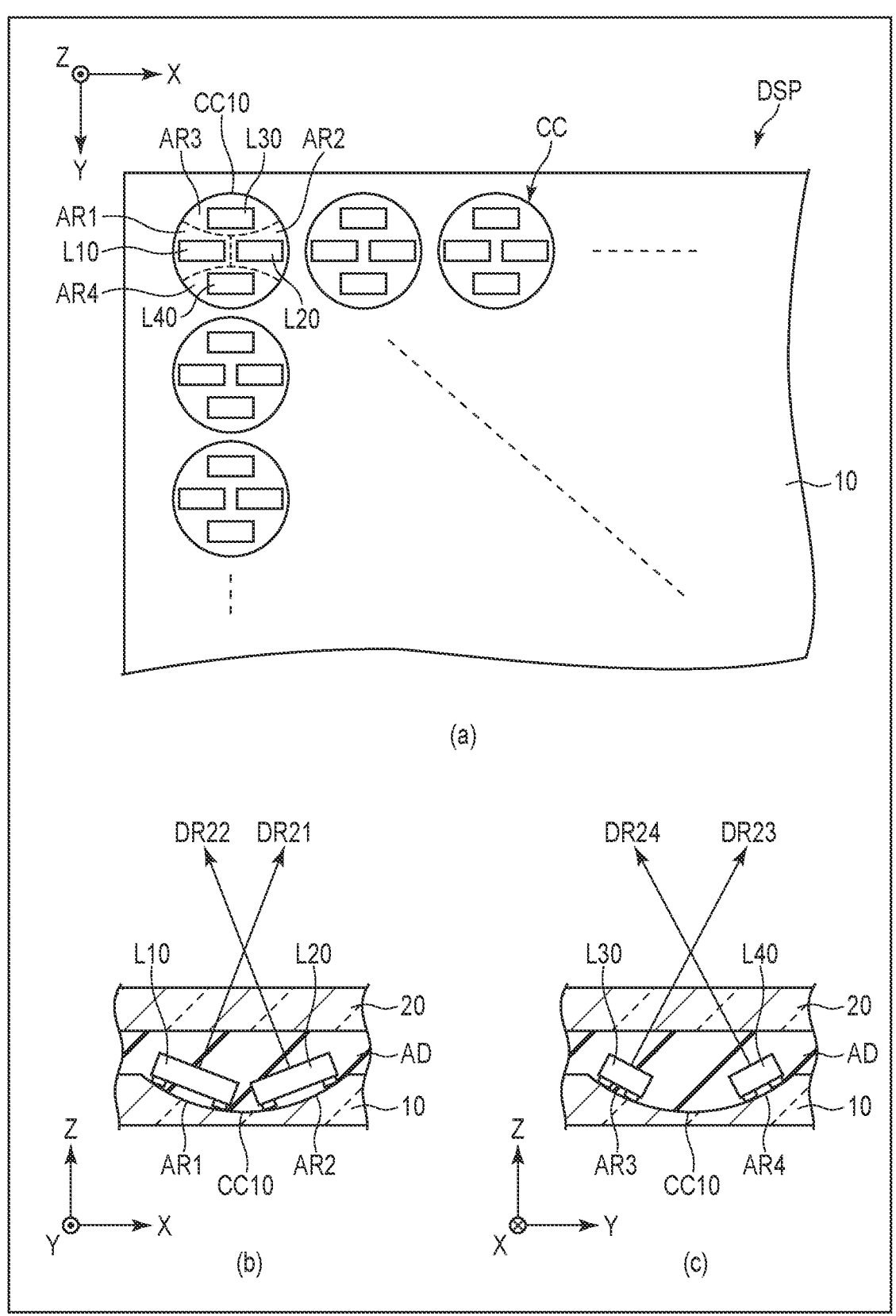
F I G. 10

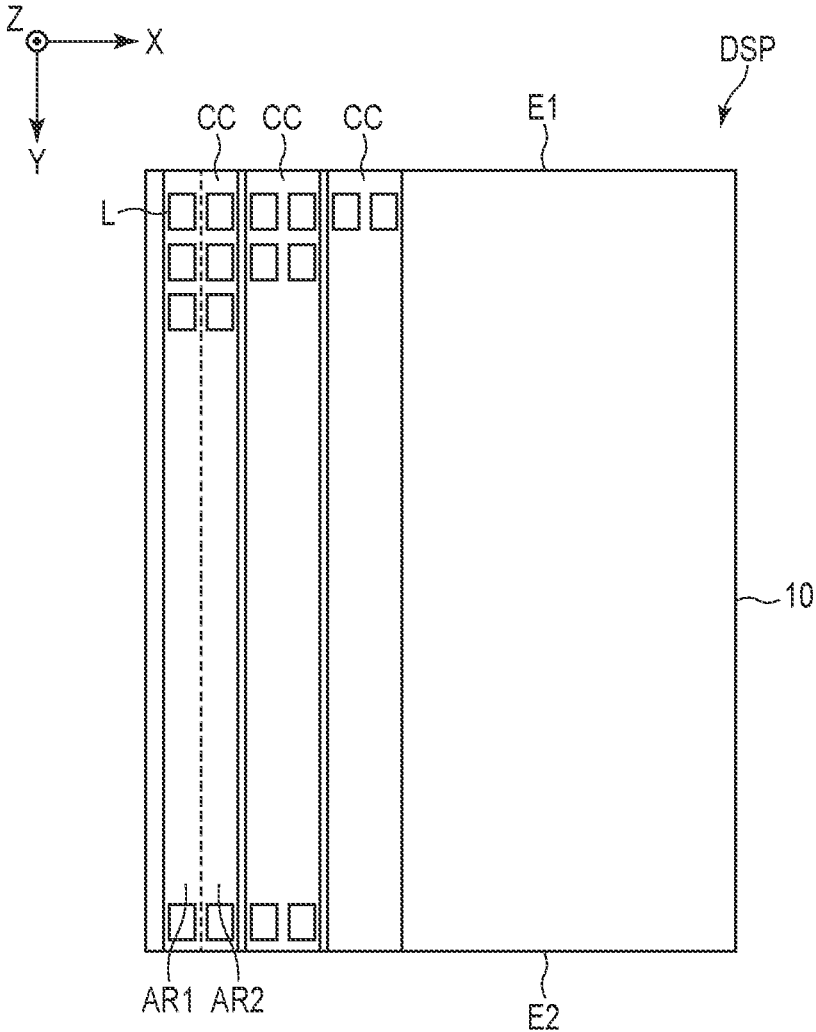
F I G. 11

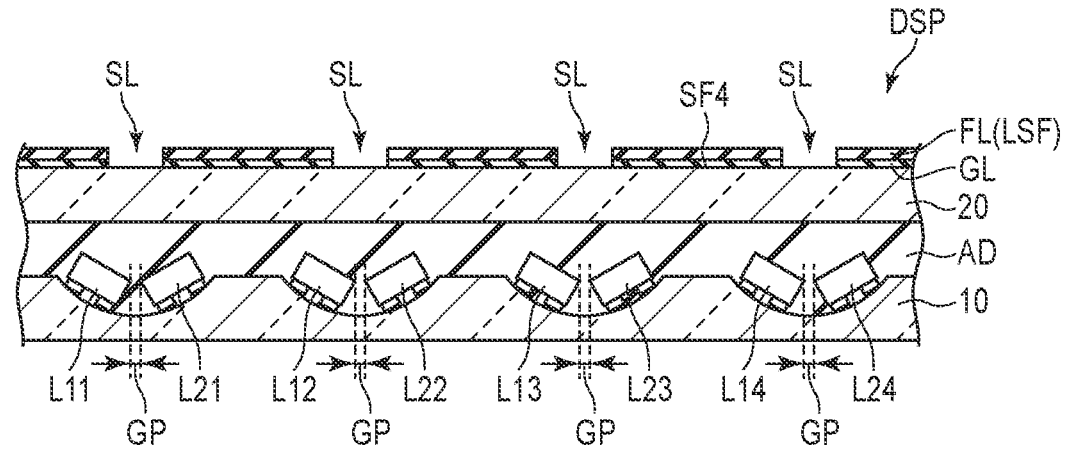
F I G. 12
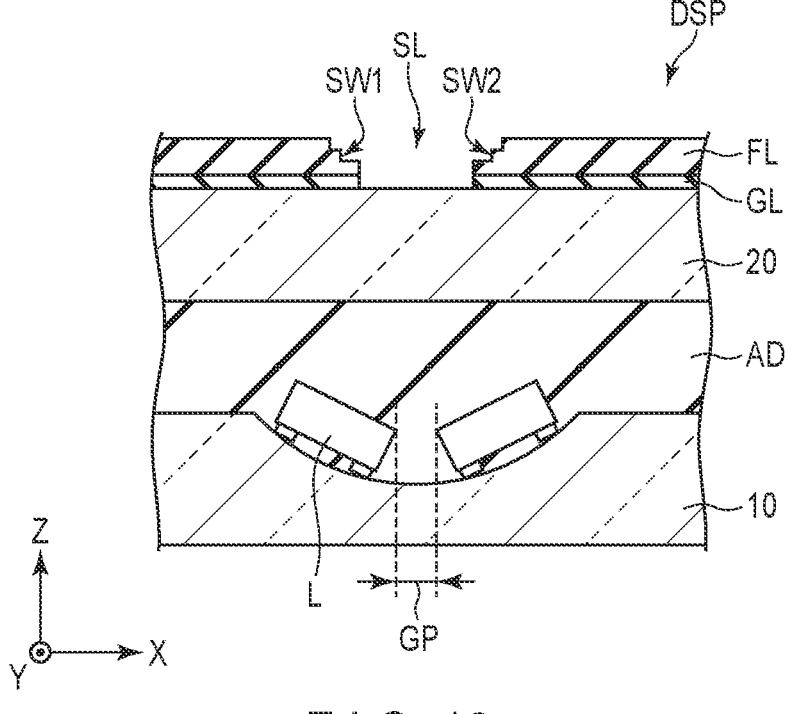
F I G. 13

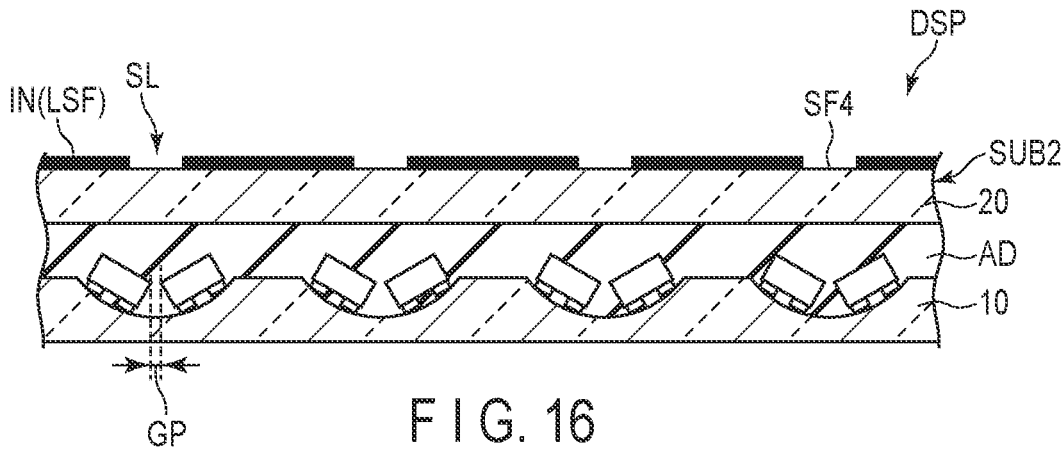
F I G. 16
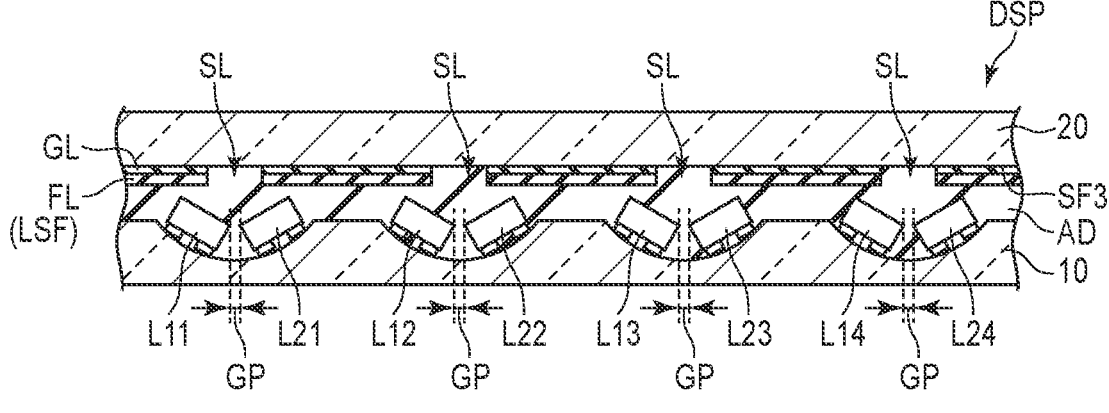
F I G. 17
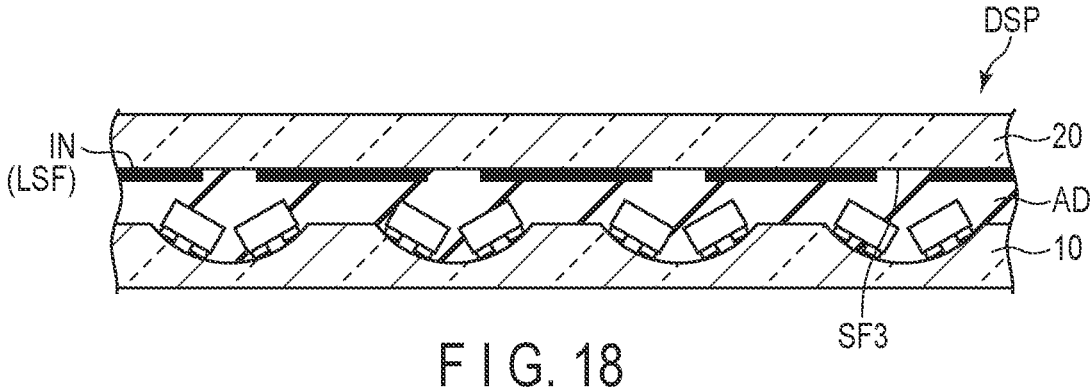
F I G. 18

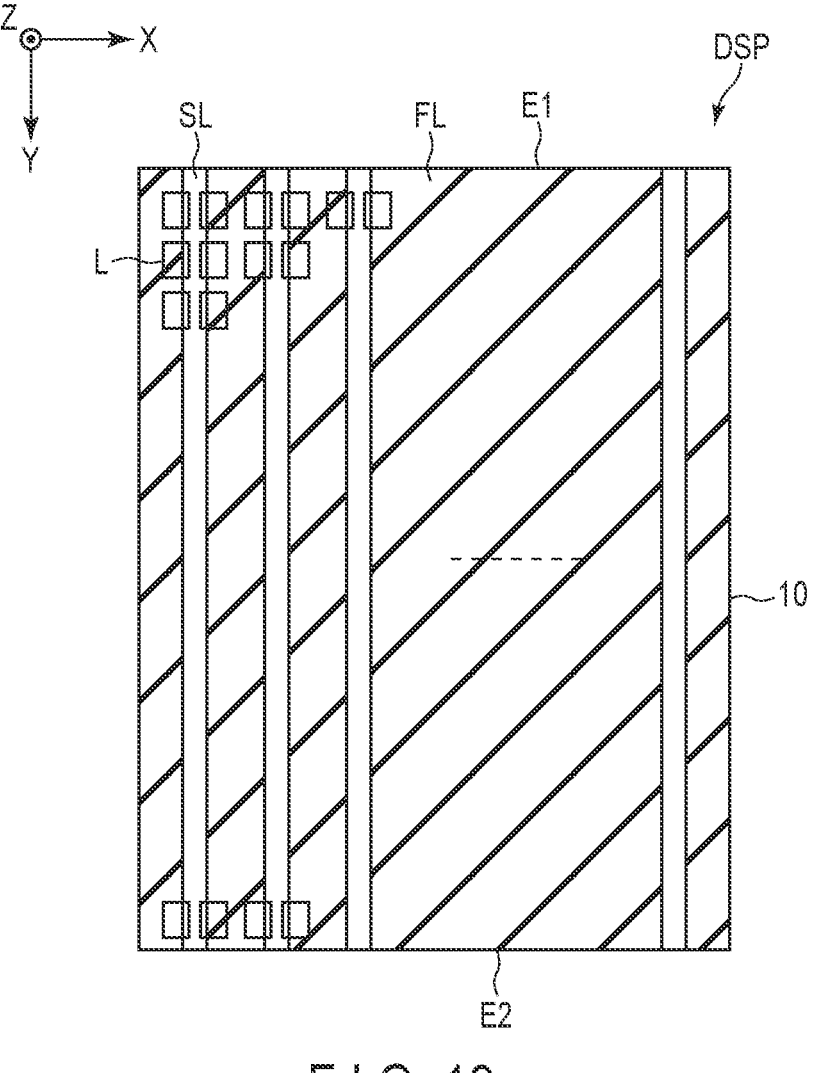
F I G. 19

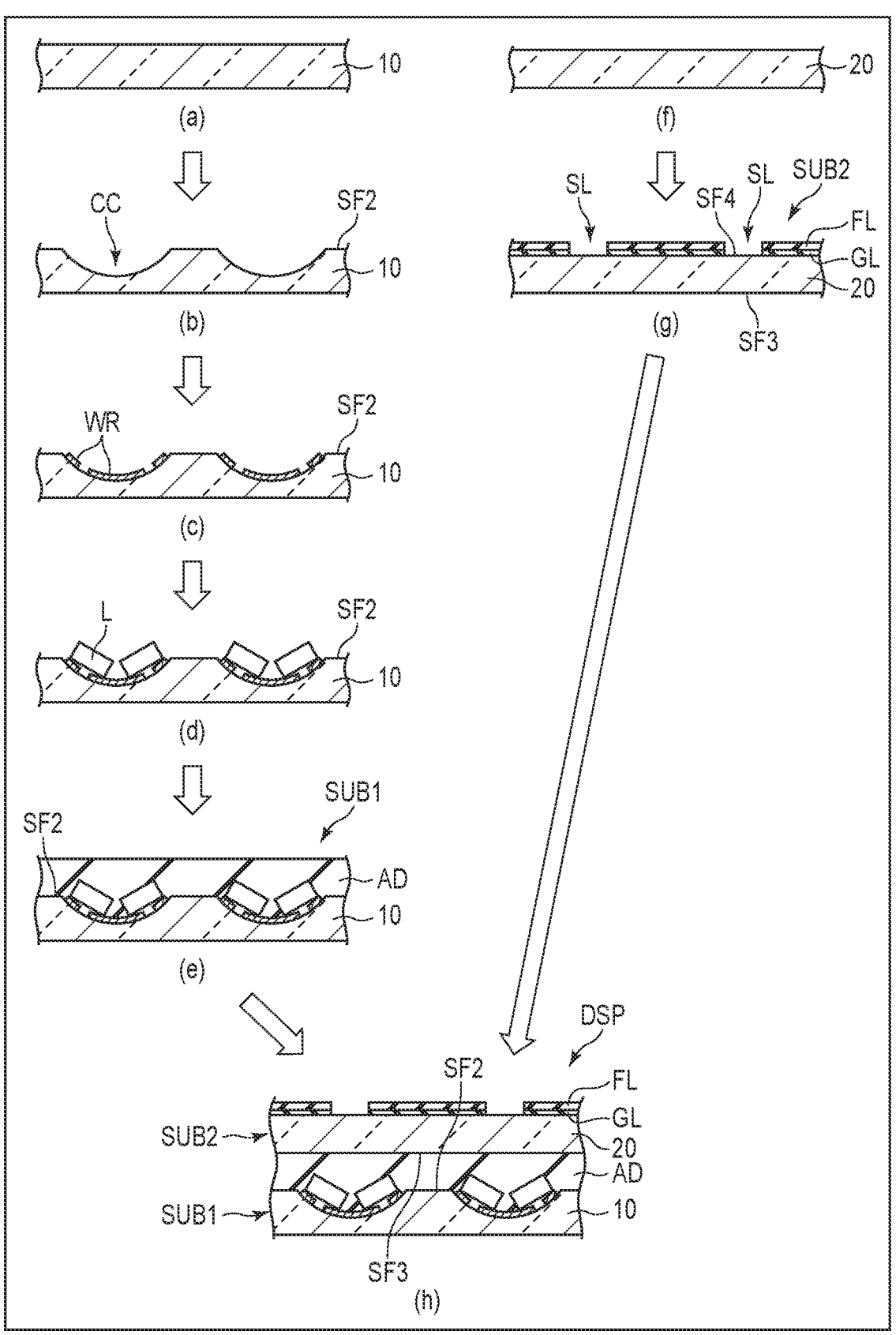
F I G. 20

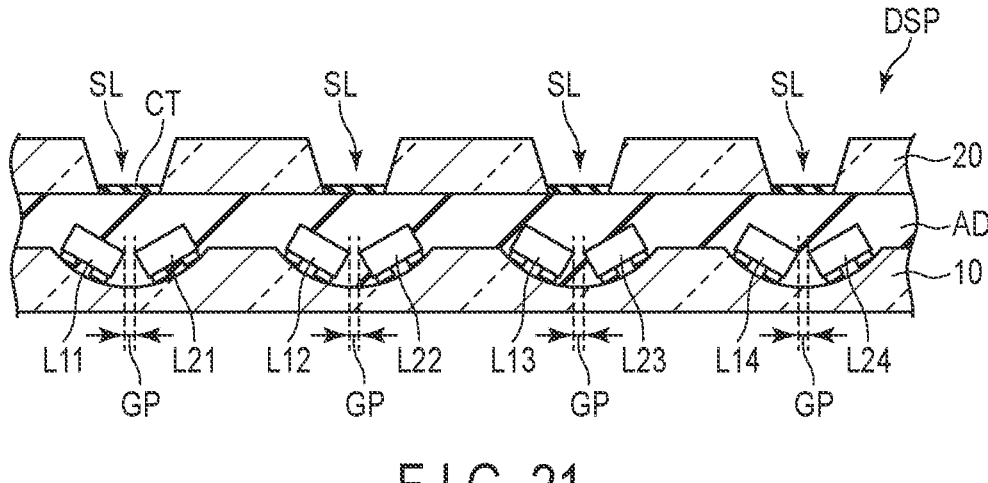
F I G. 21
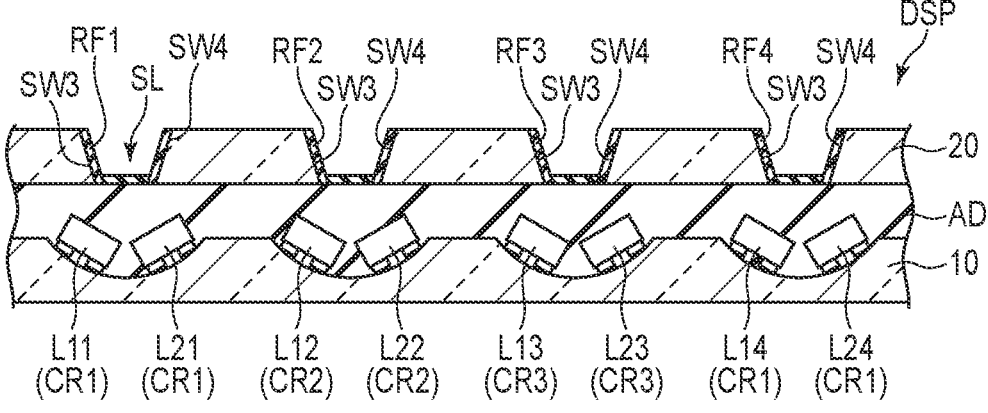
F I G. 22

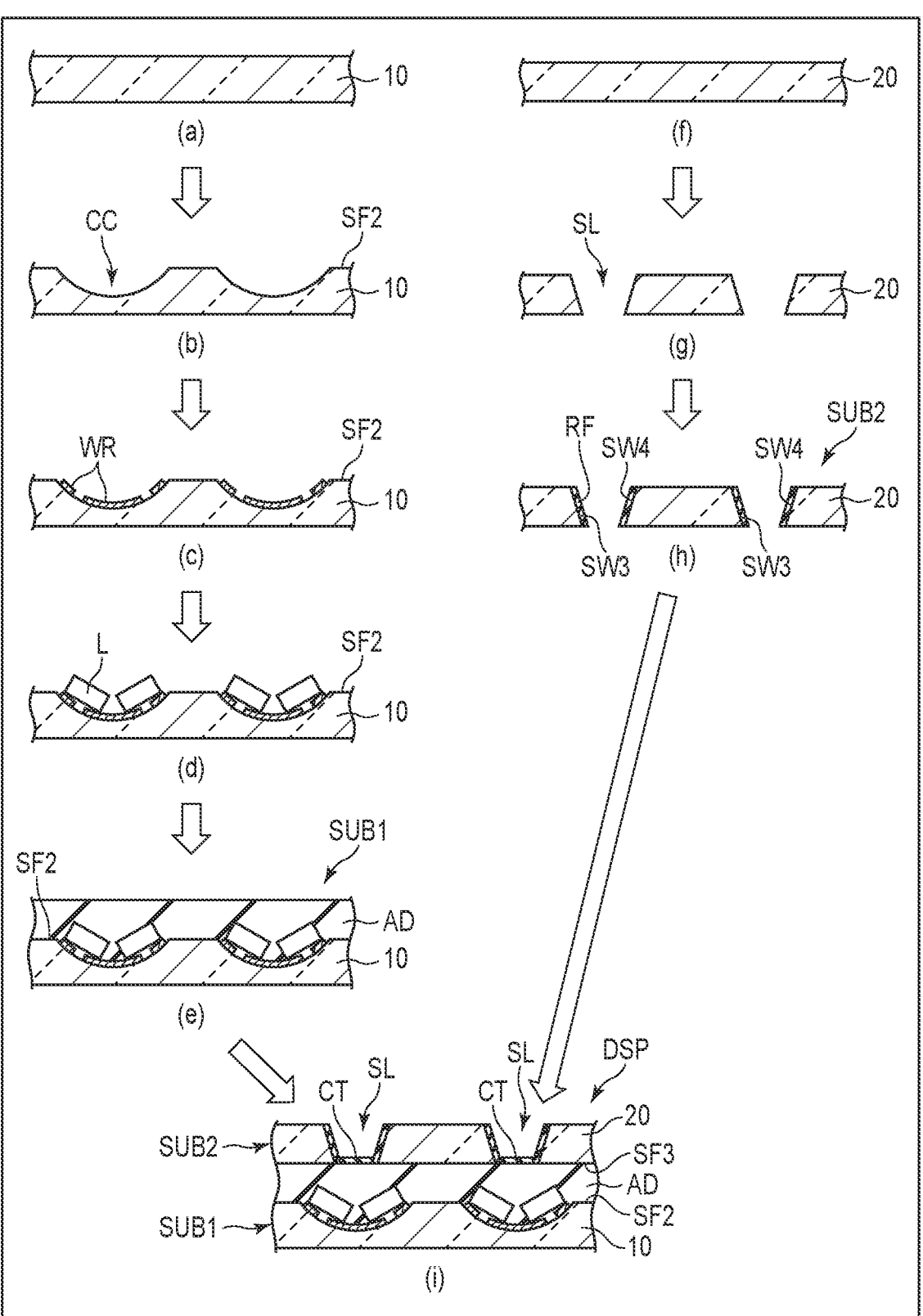
F I G. 23

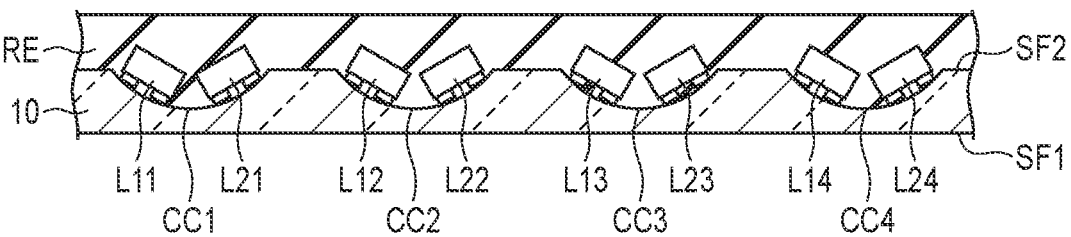
F I G. 24

DISPLAY DEVICE

CROSS-REFERENCE TO RELATED APPLICATIONS

This application is a Continuation Application of PCT Application No. PCT/JP2021/000867, filed Jan. 13, 2021 and based upon and claiming the benefit of priority from Japanese Patent Application No. 2020-056412, filed Mar. 26, 2020, the entire contents of all of which are incorporated herein by reference.

FIELD

Embodiments described herein relate generally to a display device.

BACKGROUND

LED (light-emitting diode) devices which display images by selectively allowing LED elements to emit light, have been developed. As the next generation of LED display devices, LED display devices in which micro-LEDs and mini LEDs are mounted are increasingly developed. In addition, electronic components in which electronic elements such as LED elements are mounted on bottom surfaces of recesses are known.

On the other hand, research and development are also progressing for technologies that enable a driver and a passenger to view different images on in-vehicle display devices. Here, when different images are displayed to observers on the left and right, respectively, crossing or scattering of image signals may occur.

BRIEF DESCRIPTION OF THE DRAWINGS

FIG. 1 is an exploded perspective view of a display device of the first embodiment.

FIG. 2 is a diagram showing an equivalent circuit of a first substrate shown in FIG. 1.

FIG. 3 is a cross-sectional view of the display device taken along a first direction shown in FIG. 1.

FIG. 4 is a diagram showing a first modified example of the first embodiment.

FIG. 5 is a diagram showing a second modified example of the first embodiment.

FIG. 8 is a diagram showing a fifth modified example of the first embodiment.

FIG. 9 is a diagram showing a sixth modified example of the first embodiment.

FIG. 10 is a diagram showing a seventh modified example of the first embodiment.

FIG. 11 is a plan view showing an eighth modified example of the first embodiment.

FIG. 12 is a cross-sectional view showing a display device of the second embodiment.

FIG. 13 is a cross-sectional view showing a first modified example of the second embodiment.

FIG. 16 is a cross-sectional view showing a fourth modified example of the second embodiment.

FIG. 17 is a cross-sectional view showing a fifth modified example of the second embodiment.

FIG. 18 is a cross-sectional view showing a sixth modified example of the second embodiment.

FIG. 19 is a plan view showing a seventh modified example of the second embodiment.

FIG. 20 is a cross-sectional view schematically showing a manufacturing process of the display device of the second embodiment.

FIG. 21 is a cross-sectional view showing a display device of the third embodiment.

FIG. 22 is a cross-sectional view showing a first modified example of the third embodiment.

FIG. 23 is a cross-sectional view schematically showing a manufacturing process of the display device of the third embodiment.

FIG. 24 is a cross-sectional view of a display device of the fourth embodiment.

DETAILED DESCRIPTION

Figure 6:
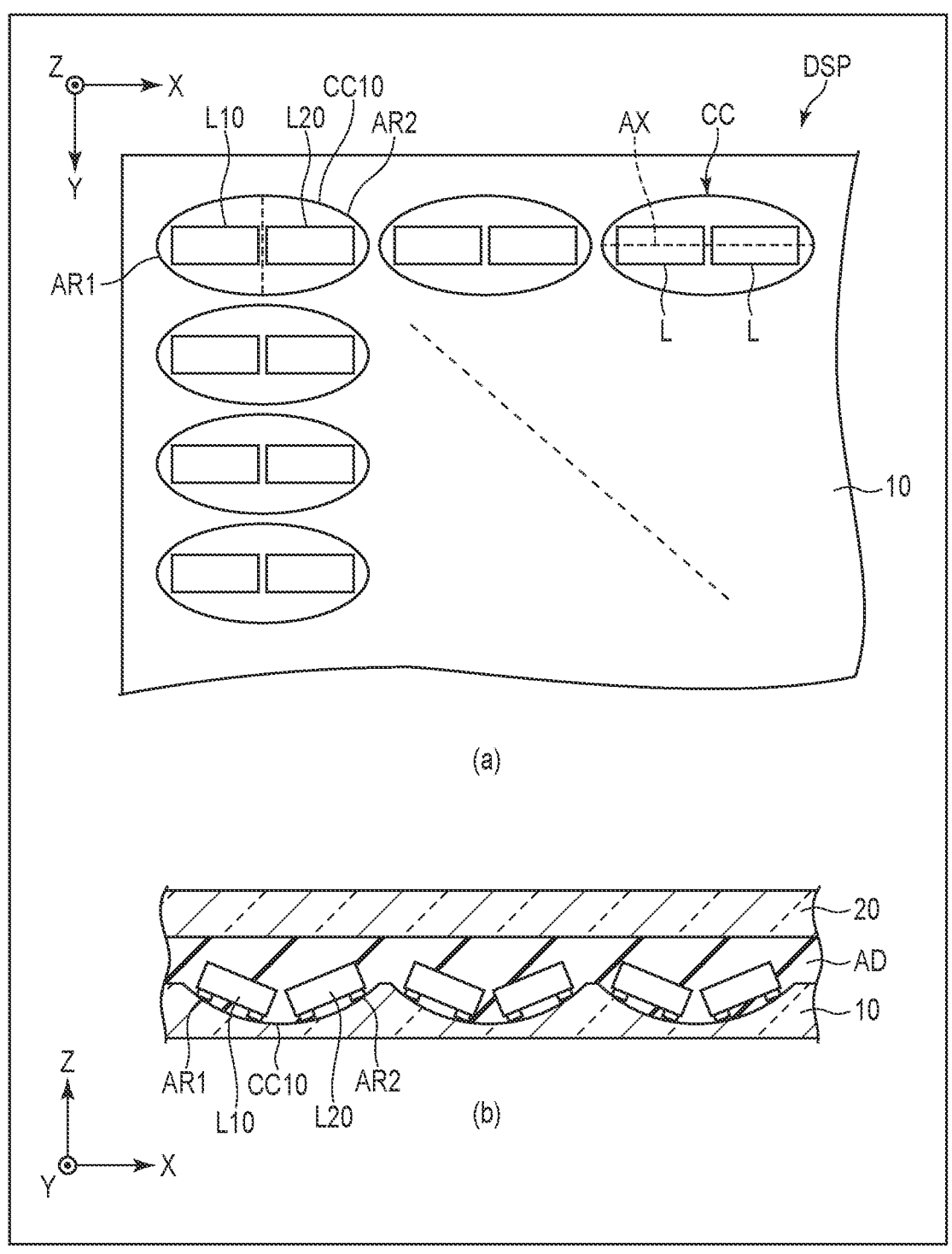
FIG. 6 is a diagram showing a third modified example of the first embodiment.

In general, according to one embodiment, an display device comprises a first insulating substrate including a first surface, a second surface on an opposite side to the first surface and a concave portion located in the second surface, and a first light-emitting element and a second light-emitting element, located in the concave portion, and an inner wall of the concave portion including a first inclined area and a second inclined area opposing the first inclined area, the first light-emitting element being located on the first inclined area, and the second light-emitting element being located on the second inclined area.

According to another embodiment, a display device comprises a first insulating substrate including a first surface, a second surface on an opposite side to the first surface, and a concave portion located in the second surface, and a first light-emitting element and a second light-emitting element located in the concave portion, and the first light-emitting element emitting light to have a peak emission intensity in a first direction and the second light-emitting element emitting light to have a peak emission intensity in a second direction different from the first direction.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

FIG. 1 is an exploded perspective view schematically showing a display device DSP of the first embodiment. The display device DSP of this embodiment is an LED (light-emitting diode) display device.

A first direction X, a second direction Y and a third direction Z shown in the figure are orthogonal to each other. But, the first direction X, the second direction Y and the third direction Z may intersect at an angle other than 90 degrees. In this specification, the direction toward the tip of the arrow indicating the third direction Z is referred to as "up" and the direction from the tip of the arrow to the opposite direction is referred to as "down". Further, when it is assumed that there is an observation position for observing the display device DSP on the tip side of the arrow indicating the third direction Z. From this observation position, viewing toward an X-Y plane defined by the first direction X and the second direction Y is referred to as a plan view.

The display device DSP comprises a first substrate SUB1 and a second substrate SUB2. The first substrate SUB1 has a first insulating substrate 10, and a plurality of light-emitting elements L mounted on the first insulating substrate 10. The second substrate SUB2 comprises a second insulating substrate 20. The light-emitting elements L are arranged in a matrix along the first direction X and the second direction Y on the first insulating substrate 10.

The first insulating substrate 10 and the second insulating substrate 20 are formed of transparent glass, resin or the like. Note that the first insulating substrate 10 does not have to be transparent because it is located on an opposite side to the display surface. The light-emitting elements L are mini-LEDs or micro-LEDs having dimensions of around 100 μm, or LEDs having dimensions smaller than 100 μm.

FIG. 2 is a diagram showing an equivalent circuit of the first substrate SUB1 shown in FIG. 1. FIG. 2 is a diagram of typical circuits for driving the light-emitting elements L, each of which uses two types of thin-film transistors (a switching transistor and a drive transistor).

The first substrate SUB1 comprises gate lines G, which may as well be referred to as scanning lines), source lines S, which may as well be referred to as video signal lines), first thin-film transistors TR1, second thin-film transistors TR2, light-emitting elements L, capacitive elements CS, first power lines 51, second power lines 52, a gate driver GD and a source driver SD.

The gate lines G each extend along the first direction X and are arranged to be spaced apart from each other along the second direction Y. The source lines S each extend along the second direction Y and are arranged to be spaced apart from each other along the first direction X. Each region compartmentalized by adjacent source lines S and adjacent gate lines G is designated as a pixel PX. Within the pixel PX, a first thin-film transistor TR1 (a switching transistor), a second thin-film transistor TR2 (a drive transistor), a light-emitting element L, a capacitive element CS and the like are disposed.

The second thin-film transistor TR2 is connected to the respective first power line 51. The first power line 51 is a power supply line which supplies current to the light-emitting element L. The light-emitting element L comprises an anode and a cathode. The first power supply line 51 is connected to one electrode, for example, the anode of the light-emitting element L via the second thin-film transistor TR2. The second power line 52 is connected to the other electrode of the light-emitting element L, for example, to the cathode. The second power line 52 is maintained at a constant potential, for example, the ground potential.

The source electrode of the first thin-film transistor TR1 is electrically connected to the respective source line S. The gate electrode of the first thin-film transistor TR1 is electrically connected to the respective gate line G. The drain electrode of the first thin-film transistor TR1 is electrically connected to the gate electrode of the second thin-film transistor TR2. The drain electrode of the second thin-film transistor TR2 is electrically connected to the respective first power line 51. The source electrode of the second thin-film transistor TR2 is electrically connected to one electrode of the light-emitting element L, for example, the anode. To the gate electrode of the second thin-film transistor TR2, a video signal from the respective source line S is input via the first thin-film transistor TR1, and thus the second thin-film transistor TR2 drives the light-emitting element L. The capacitive element CS is placed between the drain electrode and the gate electrode of the second thin-film transistor TR2, or in other words, between the first power line 51 and the gate electrode of the second thin-film transistor TR2. Since a constant potential is applied to the first power line 51, the capacitive element CS retains the potential of the gate electrode of the second thin-film transistor TR2 for a pre-determined period of time. The capacitive element CS may as well be provided between the source electrode and the gate electrode of the second thin-film transistor TR2, for example.

The gate line G is connected to the gate driver GD including a shift register, and the source line S is connected to the source driver SD including a shift register, video lines, and analog switches SD. That is, the gate driver GD and the source driver SD function as control units which control the light-emitting elements L.

In each of the pixels PX, when the first thin-film transistor TR1 is turned on as the gate signal from the gate line G is received, the video signal from the source line S is input to the gate electrode of the second thin-film transistor TR2 via the first thin-film transistor TR1. Accordingly, via the channel layer of the second thin-film transistor TR2, a current according to the magnitude of the video signal is supplied to the light-emitting element L from the first power line 51, and the light-emitting element L emits light according to the amount of current.

FIG. 3 is a cross-sectional view of the display device DSP shown in FIG. 1 taken along the first direction X.

The first insulating substrate 10 includes a first surface SF1 and a second surface SF2 on an opposite side to the first surface SF1. The second insulating substrate 20 includes a third surface SF3 opposing the second surface SF2 and a fourth surface SF4 on an opposite side to the third surface SF3. The fourth surface SF4 is equivalent to a display surface on which images are displayed.

Each of the pixels PX shown in FIG. 2 contains one light-emitting element L. Pixels PX11 to PX14 contains light-emitting elements L11 to L14, respectively. Pixels PX21 to PX24 contain light-emitting elements L21 to L24, respectively. The light-emitting elements L11 to L14 and L21 to L24 are mounted on the second surface SF2. The light-emitting elements L11 to L14 and L21 to L24 respectively correspond to the light-emitting elements L shown in FIG. 1. The light-emitting elements L11, L21, L12, L22, L13, L23, L14 and L24 are respectively adjacent to each other in this order.

The first insulating substrate 10 has concave portions CC1, CC2, CC3 and CC4 located in the second surface SF2. Inner walls of the concave portions CC1 to CC4 each include a first inclined area AR1 and a second inclined area AR2 on an opposite side to the first inclined area AR1. The first inclined area AR1 and the second inclined area AR2 oppose each other and are inclined in opposite directions to be line symmetrical in the cross section. The light-emitting elements L11 and L21 are located in the concave portion CC1. The light-emitting element L11 is mounted on the first inclined area AR1 of the concave portion CC1, and the light-emitting element L21 is mounted on the second inclined area AR2 of the concave portion CC1. The light-emitting elements L12 and L22 are located in the concave portion CC1. The light-emitting element L12 is mounted on the first inclined area AR1 of the concave portion CC2, and the light-emitting element L22 is mounted on the second inclined area AR2 of the concave portion CC2. The light-emitting elements L13 and L23 are located in the concave portion CC3. The light-emitting element L13 is mounted on the first inclined area AR1 of the concave portion CC3, and the light-emitting element L23 is mounted on the second inclined area AR2 of the concave portion CC3. The light emitting elements L14 and L24 are located in the concave portion CC4. The light-emitting element L14 is mounted on the first inclined area AR1 of the concave portioned portion CC4, and the light-emitting element L24 is mounted on the second inclined area AR2 of the concave portion CC4.

The light-emitting elements L11 to L14 emit light to have a peak emission intensity in a direction (a first direction) DR1, and the light-emitting elements L21 to L24 emit light to have a peak emission intensity in a direction (a second direction) DR2, which is different from the direction DR1. The direction DR1 is the direction perpendicular to a light emission surface LES1 of each of the light-emitting elements L11 to L14. The direction DR2 is the direction perpendicular to a light-emitting surface LES2 of each of the light-emitting elements L21 to L24. The light-emitting elements L emit light radially, but has high directivity; therefore the light-emitting elements L placed in the first inclined areas AR1 have a peak of light emission intensity in the direction DR1, and the light-emitting elements L placed in the second inclined area AR2 have a peak of light emission intensity in the direction DR2.

The display device DSP comprises an adhesive layer which adhered the second surface SF2 and the third surface SF3 together. The adhesive layer AD is located in each of the concave portions CC1 to CC4, and is in contact with the light-emitting elements L11 to L14 and L21 to L24. The adhesive layer AD is formed of, for example, an optical clear adhesive (OCA) or optical clear resin (OCR). With the adhesive layer AD, there is no air layer interposed between the first insulating substrate 10 and the second insulating substrate 20, and therefore it is possible to suppress the attenuation of light intensity.

In the example illustrated, the light-emitting elements L11 and L21 emit a first color, the light-emitting elements L12 and L22 emit a second color, the light-emitting elements L13 and L23 emit a third color, and the light-emitting elements L14 and L24 emit the first color. That is, the two light-emitting elements L disposed in each of the concave portions CC1 to CC4 are light-emitting elements of the same color. Note that the two light-emitting elements L disposed in each of the concave portions CC1 through CC4 are light-emitting elements of colors different from each other. The first, second color and third color are different from each other. For example, the first, second and third colors are any of red, blue and green, respectively.

According to this embodiment, the light-emitting elements L are mounted in the first inclined area AR1 and the second inclined area AR2 in the recess portions CC. The light-emitting elements L mounted in the first inclined areas AR1 contribute to the display of images directed in the direction DR1 and the light-emitting elements L mounted in the second inclined areas AR2 contribute to the display of images directed in the direction DR2. A viewer A visually recognizes light emitted from the light-emitting elements L mounted in the first inclined areas AR1, and another viewer B visually recognizes light emitted from the light-emitting elements L mounted in the second inclined areas AR2, and therefore the viewers A and B can view images different from each other. That is, by mounting two or more light-emitting elements L in each of the concave portions CC of the first insulating substrate 10, different images with high visibility can be displayed for multiple directions such as left/right and up/down. The display device DSP with such a configuration can be applied, for example, to an in-vehicle display device which displays different images to the driver and passengers, respectively.

FIG. 4 is a diagram showing a first modified example of the first embodiment. FIG. 4, part (a) is a plan view of a part of the display device DSP, and FIG. 4, part (b) is a cross-sectional view of the display device DSP shown in FIG. 4, part (a) taken along the second direction Y.

As shown in FIG. 4, part (a), one concave portion CC accommodates two light-emitting elements L. The concave portion CC is elliptical in plan view. A major axis AX of the elliptical shape of the concave portion CC is along the second direction Y. In the example illustrated, the light-emitting elements L are rectangular in plan view. Each light-emitting element L has a pair of long sides LS opposing each other and a pair of short sides SS opposing each other. In the example illustrated, the long sides LS are parallel to the first direction X and the short sides SS are parallel to the second direction Y. The two light-emitting elements L and the concave portion CC accommodating the two light-emitting elements L are arranged in a matrix along the first direction X and the second direction Y. Here, the light-emitting elements L10 and L20, those of the light-emitting elements L, and the concave portions CC10 are focused to explain their positional relationship. The light-emitting elements L10 and L20 are located adjacent to each other along the second direction Y in plan view. The first inclined area AR1 and the second inclined area AR2 are aligned along the second direction Y.

As shown in FIG. 4, part (b), the light-emitting elements L10 and L20 are located in the concave portion CC10. The light-emitting element L10 is mounted on the first inclined area AR1 of the concave portion CC10, and the light-emitting element L20 is mounted on the second inclined area AR2 of the concave portion CC10. The light-emitting element L10 emits light to have a peak emission intensity in the direction DR11, and the light-emitting element L20 emits light to have a peak emission intensity in the direction DR12, which is different from the direction DR11. The direction DR11 is perpendicular to the light emission surface LES3 of the light-emitting element L10. The direction DR12 is perpendicular to the light emission plane LES4 of the light-emitting element L20.

According to the first modified example, different images can be displayed towards the directions DR11 and DR12, respectively. Note that the two light-emitting elements L disposed in each of the concave portions CC may be those of the same color or of colors different from each other.

FIG. 5 is a diagram showing a second modified example of the first embodiment. FIG. 5, part (a) is a plan view of a part of the display device DSP, and FIG. 5, part (b) is a cross-sectional view of the display device DSP shown in FIG. 5, part (a) taken along the second direction Y. The configuration shown in FIG. 5 is different from that of FIG. 4 in that three light-emitting elements L are disposed in one concave portion CC.

As shown in FIG. 5, part (a), the light-emitting element L30 is located between the light-emitting elements L10 and L20. Further, the concave portion CC includes a bottom portion BT between the first inclined area AR1 and the second inclined area AR2. The first inclined area AR1, the bottom portion BT and the second inclined area AR2 are aligned along the second direction Y. The major axis AX of the elliptical shape of the concave portion CC is along the second direction Y.

As shown in FIG. 5, part (b), the light-emitting element L30 is mounted on the second surface SF2 of the first insulating substrate 10, and located in the concave portion CC10. The light-emitting element L30 is mounted on the bottom portion BT. That is, the light-emitting element L30 opposes the bottom portion BT. The light-emitting element L30 emits light to have a peak emission intensity in the direction DR13. The direction DR13 is perpendicular to the light-emitting surface LES5 of the light-emitting element L30 and is different from the direction DR11 or DR12.

According to the second modified example, different images can be displayed towards the directions DR11, DR12 and DR13, respectively. In other words, the images can be displayed to a viewer located on a direction DR13 side, which is the front direction of the display device DSP. Note that the three light-emitting elements L disposed in each of the concave portions CC may be those of the same color or of colors different from each other.

FIG. 6 is a diagram showing a third modified example of the first embodiment. FIG. 6, part (a) is a plan view of a part of the display device DSP, and FIG. 6, part (b) is a cross-sectional view of the display device DSP shown in FIG. 6, part (a) taken along the first direction X. The configuration shown in FIG. 6 is different from that of FIG. 4 in that the two light-emitting elements L accommodated in one concave portion CC are aligned along the first direction X. The first inclined area AR1 and the second inclined area AR2 are aligned along the first direction X. The major axis AX of the elliptical shape of the concave portion CC is along the first direction X.

Figure 7:
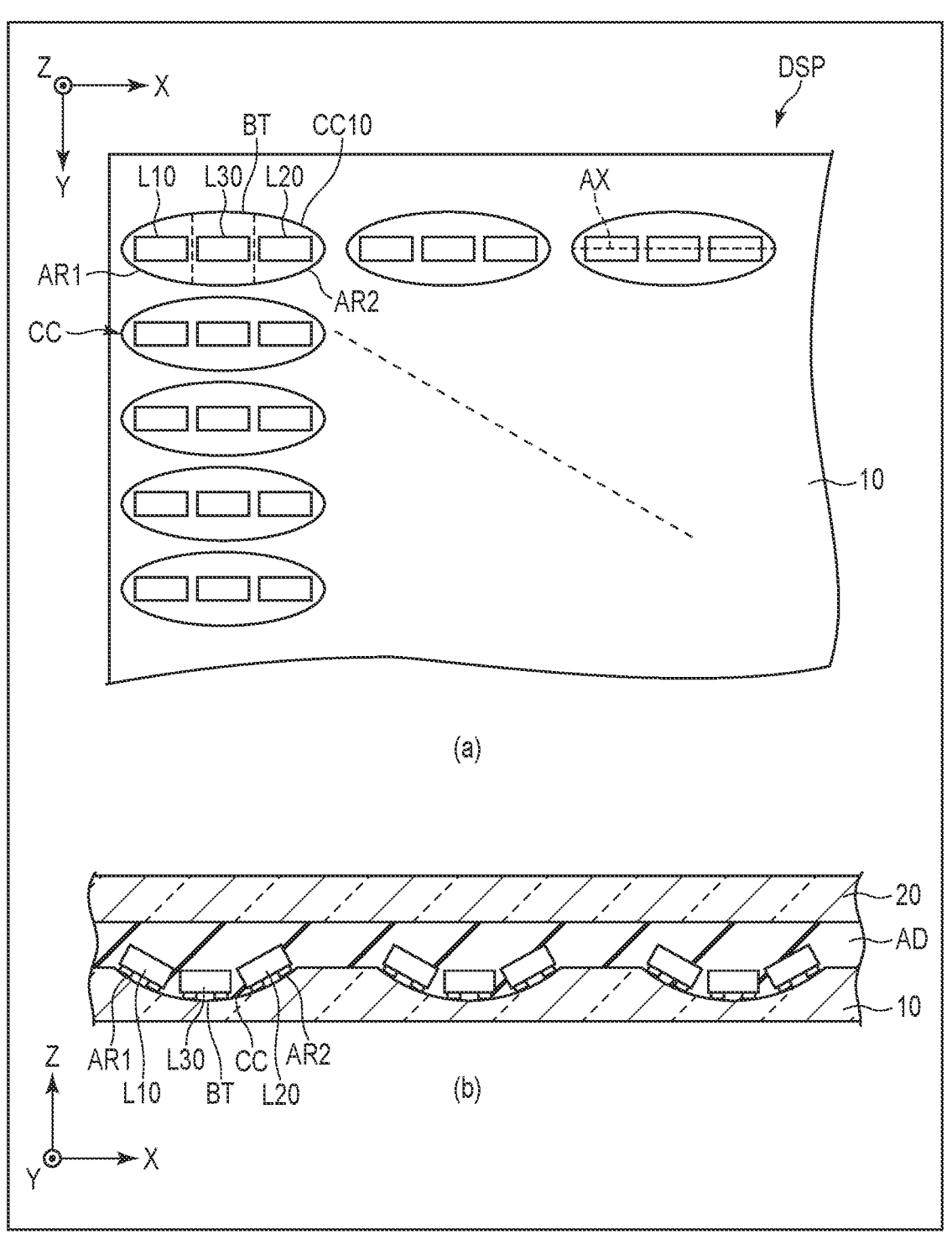
FIG. 7 is a diagram showing a fourth modified example of the first embodiment.

FIG. 7 is a diagram showing a fourth modified example of the first embodiment. FIG. 7, part (a) is a plan view of a part of the display device DSP, and FIG. 7, part (b) is a cross-sectional view of the display device DSP shown in FIG. 7, part (a) taken along the first direction X. The configuration shown in FIG. 7 is different from that of FIG. 5 in that the three light-emitting elements L accommodated in one concave portion CC are aligned along the first direction X. The first inclined area AR1, the bottom portion BT and the second inclined area AR2 are aligned along the first direction X. The major axis AX of the elliptical shape of the concave portion CC is along the first direction X.

FIG. 8 is a diagram showing a fifth modified example of the first embodiment. FIG. 8, part (a) is a plan view of a part of the display device DSP, and FIG. 8, part (b) is a cross-sectional view of the elliptical shape of the concave portion CC10 shown in FIG. 8, part (a) taken along the direction of the major axis AX. The configuration shown in FIG. 8 is different from that shown in FIG. 4 in that the two light-emitting elements L accommodated in one concave portion CC are aligned diagonally.

The major axis AX of the elliptical shape of the concave portion CC is inclined with respect to both the first direction X and the second direction Y. The light-emitting elements L10 and L20 are aligned along the direction of the major axis AX. Further, the first inclined area AR1 and the second inclined area AR2 are aligned along the direction of the major axis AX.

FIG. 9 is a diagram showing a sixth modified example of the first embodiment. FIG. 9, part (a) is a plan view of a part of the display device DSP, and FIG. 9, part (b) is a cross-sectional view of the elliptical shape of the concave portion CC10 shown in FIG. 9, part (a) taken along the direction of the major axis AX. The configuration shown in FIG. 9 is different from that of FIG. 8 in that three light-emitting elements L are disposed in one concave portion CC.

The light-emitting elements L10, L30 and L20 are aligned along the direction of the major axis AX. Further, the first inclined area AR1, the bottom portion BT and the second inclined area AR2 are aligned along the direction of the major axis AX.

FIG. 10 is a diagram showing a seventh modified example of the first embodiment. FIG. 10, part (a) is a plan view of a part of the display device DSP, and FIG. 10, part (b) is a cross-sectional view of the display device DSP shown in FIG. 10, part (a) taken along the first direction X, and FIG. 10, part (c) is a cross-sectional view of the display device DSP shown in FIG. 10, part (a) taken along the second direction Y. The configuration shown in FIG. 10 is different from that of FIG. 4 in that four light-emitting elements L are disposed in one concave portion CC.

As shown in FIG. 10, part (a), the concave portion CC is substantially circular in plan view. The light-emitting elements L10 and L20 are aligned along the first direction X in plan view. The light-emitting elements L30 and L40 are aligned along the second direction Y in plan view. The concave portion CC10 includes a first inclined area AR, a second inclined area AR2, a third inclined area AR3 and a fourth inclined area AR4. The first inclined area AR1 and the second inclined area AR2 are aligned along the first direction X. The third inclined area AR3 and the fourth inclined area AR4 are aligned along the second direction Y.

As shown in FIG. 10, part (b), the light-emitting element L10 is mounted in the first inclined area AR1 of the concave portion CC 10 and the light-emitting element L20 is mounted on the second inclined area AR2 of the concave portion CC10. The first inclined area AR1 and the second inclined area AR2 are inclined in opposite directions to be line symmetrical in a cross-sectional view. The light-emitting element L10 emits light to have a peak emission intensity in the direction DR21 and the light-emitting element L20 emits light to have a peak emission intensity in the direction DR22.

As shown in FIG. 10, part (c), the light-emitting element L30 is mounted on the third inclined area AR3 of the concave portion CC10, and the light-emitting element L40 is mounted on the fourth inclined area AR4 of the concave portion CC10. The third inclined area AR3 and the fourth inclined area AR4 are inclined in opposite directions to be line symmetrical in the cross-sectional view. The light-emitting element L30 emits light to have a peak emission intensity in the direction DR23 and the light-emitting element L40 emits light to have a peak emission intensity in the direction DR24. The directions DR21, DR22, DR23 and DR24 are directions different from each other, respectively.

According to the seventh modified example, different images can be displayed towards the directions DR21, DR22, DR23 and DR24, respectively. Note that the four light-emitting elements L disposed in each of the concave portions CC may be those of the same color or of colors different from each other. Or the light-emitting element L may be disposed in the center of the concave portion CC.

FIG. 11 is a plan view showing an eighth modified example of the first embodiment. FIG. 11 illustrates the positional relationship between the light-emitting element L and the concave portion CC. The configuration shown in FIG. 11 is different from that of FIG. 4 in the shape of the concave portion CC.

The first insulating substrate 10 includes a first end portion E1 and a second end portion E2 on an opposite side to the first end portion E1. The concave portions CC each extend from the first end portion E1 to the second end portion E2. The concave portions CC extend along the second direction Y and are aligned along the first direction X. Further, the concave portions CC each include a first inclined area AR1 and a second inclined area AR2.

Second Embodiment

Next, the second embodiment will now be described. The display device DSP of the second embodiment is different from that of the first embodiment in that it comprises a light-shielding film formed on the second insulating substrate 20.

FIG. 12 is a cross-sectional view of the display device DSP of the second embodiment. The configuration shown in FIG. 12 is different from that of FIG. 3 in that it comprises a light-shielding film LSF located on the fourth surface SF4 of the second insulating substrate 20.

The light-shielding film LSF includes a plurality of slits SL. The slits SL are located in respective positions which oppose a gap GP between the light-emitting elements L11 and L21, a gap GP between the light-emitting elements L12 and L22, a gap GP between the light-emitting elements L13 and L23 and a gap GP between the light-emitting elements L14 and L24. In the example illustrated, the light-shielding film LSF is a film FL attached to the second insulating substrate 20 using an adhesive GL. The film FL is, for example, a black film. Alternatively, the film FL may be configured of multiple layers stacking one on another, with the lowermost layer being a black film and a pattern printed on the upper layer. The adhesive GL is in contact with the fourth surface SF4.

According to the second embodiment, it is possible to suppress light leakage from the portions other than the slits SL. That is, only light with good visibility can be transmitted through the slits SL.

FIG. 13 is a cross-sectional view showing a first modified example of the second embodiment. The configuration shown in FIG. 13 is different from that of FIG. 12 in the shape of slits SL.

The slits SL each includes a first sidewall SW1 and a second sidewall SW2 on an opposite side to the first sidewall SW1. The first sidewall SW1 and the second sidewall SW2 each include a stepped portion. With the stepped portion thus formed in the first sidewall SW1 and the second sidewall SW2, the width of the slit SL in the first direction X increases towards an upper section thereof. With this configuration, it is possible to suppress the shielding of light by the first sidewall SW1 and the second sidewall SW2.

Figure 14:
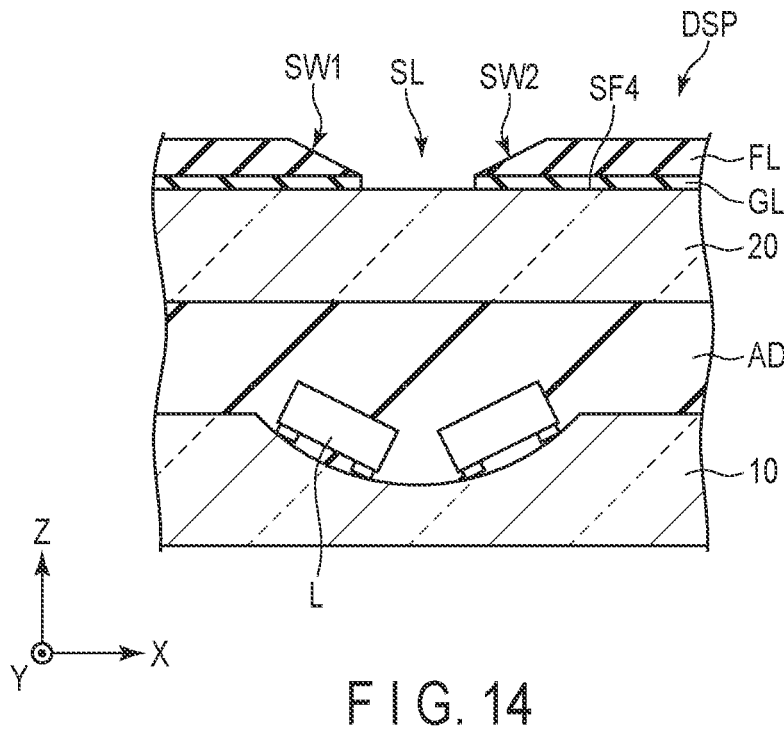
FIG. 14 is a cross-sectional view showing a second modified example of the second embodiment.

FIG. 14 is a cross-sectional view showing a second modified example of the second embodiment. The configuration shown in FIG. 14 is different from that of FIG. 12 in the shape of the slits SL.

The first sidewall SW1 and the second sidewall SW2 are inclined with respect to the fourth surface SF4. With the first sidewall SW1 and the second sidewall SW2 formed tapered, the width of the slit SL along the first direction X increases towards an upper section. Therefore, it is possible to suppress the shielding of light by the first sidewall SW1 and the second sidewall SW2.

Figure 15:
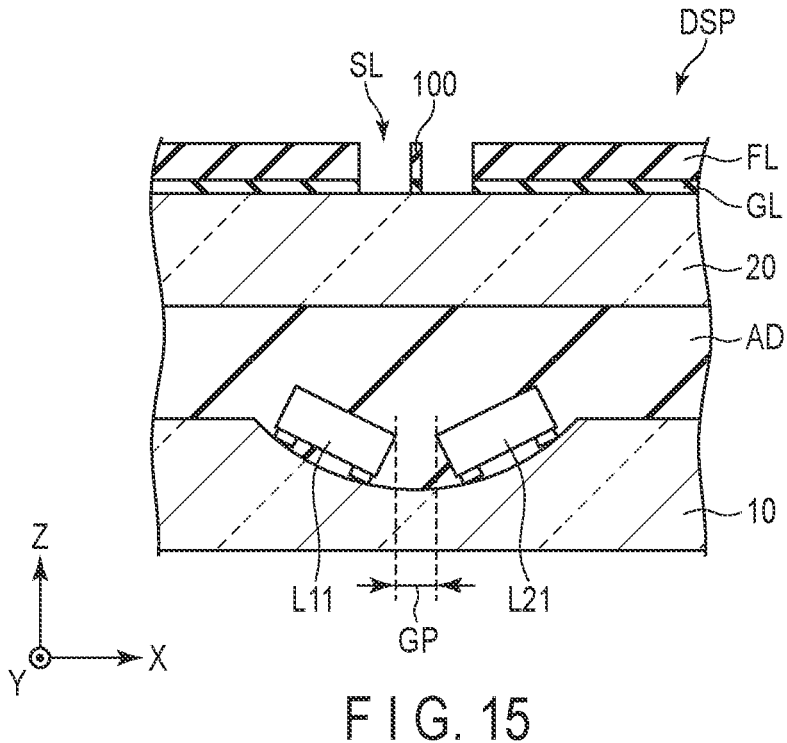
FIG. 15 is a cross-sectional view showing a third modified example of the second embodiment.

FIG. 15 is a cross-sectional view showing a third modified example of the second embodiment. The configuration shown in FIG. 15 is different from that of FIG. 12 in the shape of the slits SL.

The slit SL includes a screen at a position opposing the gap GP between the light-emitting elements L11 and L21. The screen 100 shields the light emitted from the slit SL in the third direction Z. Thus, the directivity of the light toward the viewers on the left and right can be increased.

FIG. 16 is a cross-sectional view showing a fourth modified example of the second embodiment. The configuration shown in FIG. 16 is different from that of FIG. 12 in that the light-shielding film LSF is ink IN printed on the insulating substrate 20.

The ink IN is in contact with the fourth surface SF4. When the ink IN is printed on the second insulating substrate 20 in place of attaching the film FL thereon, the thickness of the second substrate SUB2 can be reduced. The printing is not limited to printing in black color only, but may as well be printing of a pattern.

FIG. 17 is a cross-sectional view showing a fifth modified example of the second embodiment. The configuration shown in FIG. 17 is different from that of FIG. 12 in that the light-shielding film LSF is located on the third surface SF3 of the second insulating substrate 20.

The light-shielding film LSF is in contact with the adhesive layer AD. The light-shielding film LSF includes slits SL at respective positions opposing a gap GP between the light-emitting elements L21 and L22, a gap GP between the light-emitting elements L12 and L22, a gap between the light-emitting elements L13 and L23 and a gap GP between light-emitting elements L14 and L24. In the example illustrated, the light-shielding film LSF is a film FL attached to the second insulating substrate 20 using an adhesive GL. The adhesive GL is in contact with the third surface SF3.

FIG. 18 is a cross-sectional view showing a sixth modified example of the second embodiment. The configuration shown in FIG. 18 is different from that of FIG. 17 in that the light-shielding film LSF is an ink IN printed on the insulating substrate 20. The ink IN is in contact with the third surface SF3.

FIG. 19 is a plan view showing a seventh modified example of the second embodiment. FIG. 19 shows the positional relationship between the light-emitting elements L and the slits SL, respectively.

The first insulating substrate 10 has a first end portion E1 and a second end portion E2 on an opposite side to the first end portion E1. The slits SL each extend from the first end portion E1 to the second end portion E2. The slits SL each extend along the second direction Y and are aligned along the first direction X. Note that the slits SL may be formed in such a way that one slit SL is formed for two light-emitting elements L, or one slit SL is formed for a certain number of light-emitting elements L.

FIG. 20 is a cross-sectional view schematically showing processing steps for manufacturing of the display device DSP of the second embodiment.

As shown in FIG. 20, part (h), the display device DSP is formed by stacking the first substrate SUB1 and the second substrate SUB2 one on another.

FIG. 20, in part (a) to part (e), shows the processing steps of forming the first substrate SUB1. As shown in FIG. 20, part (a), the first insulating substrate 10 is prepared. As shown in FIG. 20, part (b), concave portions CC are formed in the second surface SF2 of the first insulating substrate 10 by a physical or chemical process such as laser or etching. As shown in FIG. 20, part (c), wiring lines WR, insulating films and the like are formed on the second surface SF2. As shown in FIG. 20, part (d), light-emitting elements L are mounted on the wiring lines WR on the second surface SF2. As shown in FIG. 20, part (e), the adhesive layer AD is applied on the second surface SF2 side.

FIG. 20, in part (f) and part (g), shows the processing steps for forming the second substrate SUB2. As shown in FIG. 20, part (f), the second insulating substrate 20 is prepared. As shown in FIG. 20, part (g), the film FL is attached on the fourth surface SF4 by the adhesive GL. The film FL has slits SL formed in advance. Note that the figure shows an example in which the film FL is attached to the fourth surface SF4, but the film FL may be attached to the third surface SF3 or the third surface SF3 or the fourth surface SF4 may be printed with the ink IN.

The first substrate SUB1 at the stage shown in FIG. 20, part (e) and the second substrate SUB2 at the stage shown in FIG. 2, part (g) are attached together. At this time, second surface SF2 and the third surface SF3 oppose each other and are adhered together by the adhesive layer AD.

Third Embodiment

Next, the third embodiment will now be described. A display device DSP of the third embodiment is different from the display device DSP of the first embodiment in that the second insulating substrate 20 includes slits SL.

FIG. 21 is a cross-sectional view showing the display device DSP according to the third embodiment. The configuration shown in FIG. 21 is different from that of FIG. 3 in that the second insulating substrate 20 includes slits SL.

The second insulating substrate 20 includes a plurality of slits SL. The slits SL are formed in positions respectively opposing a gap GP between the light-emitting elements L11 and L21, a gap GP between light-emitting elements L12 and L22, a gap GP between light-emitting elements L13 and L23 and a gap GP between light-emitting elements L14 and L24. The coating layer CT is formed of a transparent material and covers the adhesive layer AD inside the slits SL. With this configuration, it is possible to prevent the adhesive layer AD from being exposed from the slits SL.

According to the third embodiment, light can be output directly from the slits SL without passing through the second insulating substrate 20. With this configuration, attenuation of light, which may be caused by the transmittance of the second insulating substrate 20 can be suppressed.

FIG. 22 is a cross-sectional view showing a first modified example of the third embodiment. The configuration shown in FIG. 22 is different from that of FIG. 21 in that reflective films RF1 to RF4 are located on side walls of the slits SL.

The slits SL each include a third sidewall SW3 and a fourth sidewall SW4 on an opposite side to the third sidewall SW3. The reflective films RF1 to RF4 are attached to the third sidewall SW3 and the fourth sidewall SW4 of each of the slits SL. The reflective films RF1 to RF4 consist of stacked multilayers. The light-emitting elements L11 and L21 emit a first color CR1, and the reflective film RF1 is a reflective film that easily reflects the first color CR1. The light-emitting elements L12 and L22 emit a second color CR2, and the reflective film RF2 is a reflective film that easily reflects the second color CR2. The light-emitting elements L13 and L23 emit a third color CR3, and the reflective film RF3 is a reflective film that easily reflects the third color CR3. The light-emitting elements L14 and L24 emit the first color CR1, and the reflective film RF4 is a reflective film that easily reflects the first color CR1. That is, the reflective films RF1 to RF4 are different reflective films respectively corresponding to emission colors of the light-emitting elements L. With the reflective films RF1 to RF4 thus disposed, it is possible to increase the luminance of the light emitted from the slits SL.

FIG. 23 is a cross-sectional view schematically showing processing steps for manufacturing the display device DSP of the third embodiment.

As shown in FIG. 23, part (i), the display device DSP is formed by stacking the first substrate SUB1 and the second substrate SUB2 on one on another. FIG. 23, part (a) to part (e) are the same in structure as those shown in FIG. 20, part (a) to part (e).

FIG. 23, in part (f) to part (h), shows the processing step of forming the second substrate SUB2. As shown in FIG. 23, part (f), the second insulating substrate 20 is prepared. Then, as shown in FIG. 23, part (g), slits SL are formed in the second insulating substrate 20 using laser or etching. As shown in FIG. 23, part (h), the reflective films RF are formed respectively on the third sidewall SW3 and the fourth sidewall SW4 of each of the slits SL.

The first substrate SUB1 at the stage shown in FIG. 23, part (e) and the second substrate SUB2 at the stage shown in FIG. 3, part (h) are adhered together. Here, the second surface SF2 and the third surface SF3 oppose each other and are adhered together by the adhesive layer AD. Then, inside each slit SL, a coating layer CT is formed to cover the adhesive layer AD.

Fourth Embodiment

Next, the fourth embodiment will now be described. A display device DSP shown in the fourth embodiment is different from the display device DSP of the first embodiment in that the second insulating substrate 20 is not formed and the resin layer RE covers the first insulating substrate 10.

FIG. 24 is a cross-sectional view showing the display device DSP according to the fourth embodiment. The resin layer RE covers the second surface SF2 of the first insulating substrate 10. The resin layer RE is located in each of the concave portions CC1 to CC4, and is in contact with each of the light-emitting elements L11 to L14 and L21 to L24.

As described above, according to this embodiment, a display device which can display different images in multiple directions can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a first insulating substrate including a first surface, a second surface on an opposite side to the first surface and a concave portion located in the second surface;
   a first light-emitting element and a second light-emitting element, located in the concave portion, portion;
   a second insulating substrate including a third surface opposing the second surface of the first insulating substrate and a fourth surface on an opposite side to the third surface; and an adhesive layer which adheres the second surface and the third surface to each other, wherein an inner wall of the concave portion includes a first inclined area and a second inclined area opposing the first inclined area, the first light-emitting element is located on the first inclined area, the second light-emitting element is located on the second inclined area, the adhesive layer is located in the concave portion and is in contact with at least the first light-emitting element and the second light-emitting element, the second insulating substrate includes a slit at a position opposing a gap between the first light-emitting element and the second light-emitting element, and the slit includes a third sidewall and a fourth sidewall on an opposite side to the third sidewall, and a reflective film is attached to the third sidewall and the fourth side wall.

2. The display device of claim 1, further comprising:

a third light-emitting element located in the concave portion, wherein the concave portion includes a bottom portion between the first inclined area and the second inclined area, and the third light-emitting element is located between the first light-emitting element and the second light-emitting element and opposes the bottom portion.

3. The display device of claim 1, further comprising:

a resin layer which covers the second surface of the first insulating substrate, wherein the resin layer is located in the concave portion and is in contact with at least the first light-emitting element and the second light-emitting element.

4. The display device of claim 1, further comprising:

a light-shielding film located on the fourth surface of the second insulating substrate, wherein the light-shielding film includes a slit at a position opposing a gap between the first light-emitting element and the second light-emitting element.

5. The display device of claim 1, further comprising:

a light-shielding film located on the third surface of the second insulating substrate and being in contact with the adhesive layer, wherein the light-shielding film includes a slit at a position opposing a gap between the first light-emitting element and the second light-emitting element.

6. The display device of claim 4, wherein the light-shielding film is a film attached to the second insulating substrate, or ink printed on the second insulating substrate.

7. The display device of claim 4, wherein the slit includes a first sidewall and a second sidewall on an opposite side to the first sidewall, and the first side wall and the second side wall include a stepped portion.

8. The display device of claim 4, wherein the slit includes a first sidewall and a second sidewall on an opposite side to the first sidewall, and the first sidewall and the second sidewall are inclined with respect to the fourth surface.

9. The display device of claim 4, wherein the slit includes a screen at a position opposing a gap between the first light-emitting element and the second light-emitting element.

10. The display device of claim 1, wherein the concave portion is elliptical in plan view.

11. The display device of claim 1, wherein the first insulating substrate includes a first end portion and a second end portion on an opposite side to the first end portion, and the concave portion extends from the first end portion towards the second end portion.

12. The display device of claim 4, wherein the first insulating substrate includes a first end portion and a second end portion on an opposite side to the first end portion, and the slit extends from the first end portion towards the second end portion.

13. A display device comprising:

a first insulating substrate including a first surface, a second surface on an opposite side to the first surface, and a concave portion located in the second surface;

a first light-emitting element and a second light-emitting element located in the concave portion, a second insulating substrate including a third surface opposing the second surface of the first insulating substrate and a fourth surface on an opposite side to the third surface; and an adhesive layer which adheres the second surface and the third surface to each other, wherein the first light-emitting element emits light to have a peak emission intensity in a first direction, the second light-emitting element emits light to have a peak emission intensity in a second direction different from the first direction, the adhesive layer is located in the concave portion and is in contact with at least the first light-emitting element and the second light-emitting element, the second insulating substrate includes a slit at a position opposing a gap between the first light-emitting element and the second light-emitting element, and the slit includes a third sidewall and a fourth sidewall on an opposite side to the third sidewall, and a reflective film is attached to the third sidewall and the fourth side wall.

14. The display device of claim 13, further comprising:

a third light-emitting element located in the concave portion, wherein the third light-emitting element emits light to have a peak emission intensity in a third direction different from the first direction and the second direction.

* * * * *